Inventor
Vernon E. Schmidt
By Alois W. Graf
attorney

Oct. 6, 1959 V. E. SCHMIDT 2,907,996

CODE GENERATOR

Filed May 31, 1955 5 Sheets-Sheet 2

Inventor
Vernon E. Schmidt
By Alois W. Graf
attorney

Inventor
Vernon E. Schmidt
By Alois W. Graf
Attorney

Inventor
Vernon E. Schmidt
By Alois W. Graf
Attorney

Inventor
Vernon E. Schmidt
By Ali Wlaf Attorney

United States Patent Office 2,907,996
Patented Oct. 6, 1959

2,907,996

CODE GENERATOR

Vernon E. Schmidt, Newport, Ky., assignor to The Baldwin Piano Company, Cincinnati, Ohio, a corporation of Ohio Application May 31, 1955, Serial No. 512,032

12 Claims. (Cl. 340—345)

This invention relates to code generators, and more particularly to such generators which are used in producing a plurality of distinct codes or code discs.

In the past, various code generators have been devised to produce such codes as the linear cyclic binary, the linear straight binary, and the sinusoidal cyclic binary codes. To have these codes produced by separate equipment would be an expensive and space consuming method, and it has accordingly been the practice to design code generators to produce more than one of the cited codes or code discs. The present generator provides, among other functions, for the production of all three of these binary codes utilizing a circuit combination which requires less tube stages, space, and the expenditure of money than has heretofore been the case.

Accordingly, it is an object of this invention to provide a new and improved code generator.

Another object of this invention is to provide an improved code generator capable of producing a plurality of distinct codes with a minimum of equipment.

Another object of this invention is to provide an improved code generator which is inexpensive to produce, simple in design, and dependable in operation.

A still further object of this invention is to provide an improved code generator in which, using a straight binary code producing equipment, a cyclic binary code is produced by triggering a binary scalar with the edge of a pulse, which edge is not used to trigger the scalars in the straight binary code producing equipment.

A further object of this invention is to provide an improved code generator requiring a minimum number of flip-flop circuits in its digit selector divider chain.

Other objects and advantages of the invention will be apparent during the course of the following description when read in connection with the accompanying drawings, wherein.

In order to bring out the practical application of the novel code generator of this invention, the generator will be described in conjunction with elements capable of making coded discs usable, among others, in the analog-to-digital converter field. The type of code pattern which can be produced by the typical embodiment to be described is shown in Figure 1.

Figure 1:
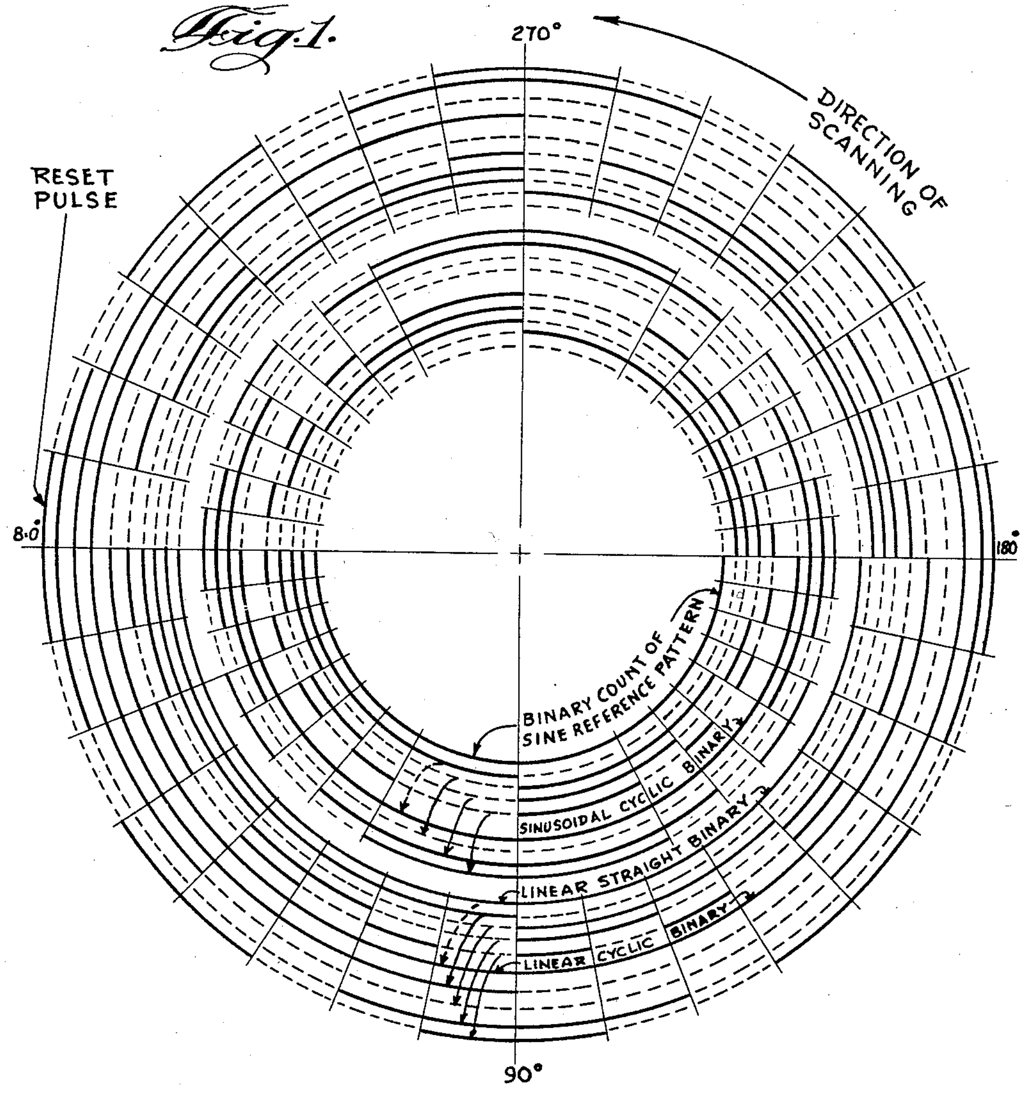
Figure 1 shows a partial representation of the code patterns which may be produced with the device embodying this invention.

The code disc shown in Figure 1 has inscribed on its face, going from the outside to the inside of the code circles, a linear cyclic binary code, a linear straight binary code and a sinusoidal cyclic binary code. Additional code circles shown are concerned with the binary count of sine reference patterns, but not being pertinent to the novel features of the code generator, will not be further described.

The procedure necessary for converting information from the cyclic binary code to the straight binary code is best expressed in mathematical terms.

Letting $b_nb_{n-1} \dots b_2b_1b_0$ represents the cyclic code, and letting $a_na_{n-1}a_{n-2} \dots a_1a_0$ represent the straight code for a number N, where $$N=[a_n2^n+a_{n-1}2^{n-1}+ \dots a_22^2+a_12^1+a_02^0]$$

where $A_K$ is equal to any $(a)$ term, $b_K$ is equal to any $(b)$ term, $a=1$ or 0, and $b=1$ or 0, it can be shown that:

$$a_K=\frac{1-(-1)^{b_n+b_{n-1}+b_{n-2}\dots b_K}}{2}$$

This means that if the sum of the digits $b_n$ through $b_K$ is odd, the digit $a_K$ is 1. If the sum $b_n$ through $b_K$ is even, the digit $a_K$ is 0. Thus, $$N=\sum_{K=0}^{K=n}\left[\frac{1-(-1)^{\sum_{R=n}^{R=K} b_K}}{2}\right]2^K$$

where N is equal to any straight binary number.

An analysis of the mathematical relationship between the two codes shows a complete correlation between the straight and cyclic codes. Noting now the showing of the linear cyclic binary code and linear straight binary code in Figure 1, it becomes apparent that the solid lines represent 0 and the dash lines represent 1. If these codes are now considered as counting consecutively from $\theta=0°$ to $\theta=360°$, the most significant digit becomes a part of the scalar number and must be 0 at $\theta=0°+d\theta$, where $d\theta$ is less than one quantum. The most significant digit can be regarded as giving the sign if one defines $+=0$ and $-=1$. The cyclic sine function code has a similar relationship to the straight binary code as the linear cyclic code, with the exception that the inner circle of the code pattern is now only the sign of the number. Since the sine code may be expressed with the same degree of accuracy as the other codes in two less zones (excluding the sign), the sinusoidal cyclic binary code may be reduced to code circles in a smaller total space than is required for the linear cyclic binary code. In the present embodiment, only four circles are required instead of the five for the linear cyclic binary code. Again, the inner circle for this code indicates the sign.

The systems shown in Figures 2 through 5 are capable of producing a linear cyclic binary code pattern, a linear straight binary code pattern, and a sinusoidal cyclic binary code pattern, each to an accuracy of $2^{16}$. Thus at least sixteen circles of information would appear on code discs carrying such code patterns. To illustrate the different code patterns which may be generated only four or five of the first circles of such code patterns have been designated in Figure 1.

Figure 2:
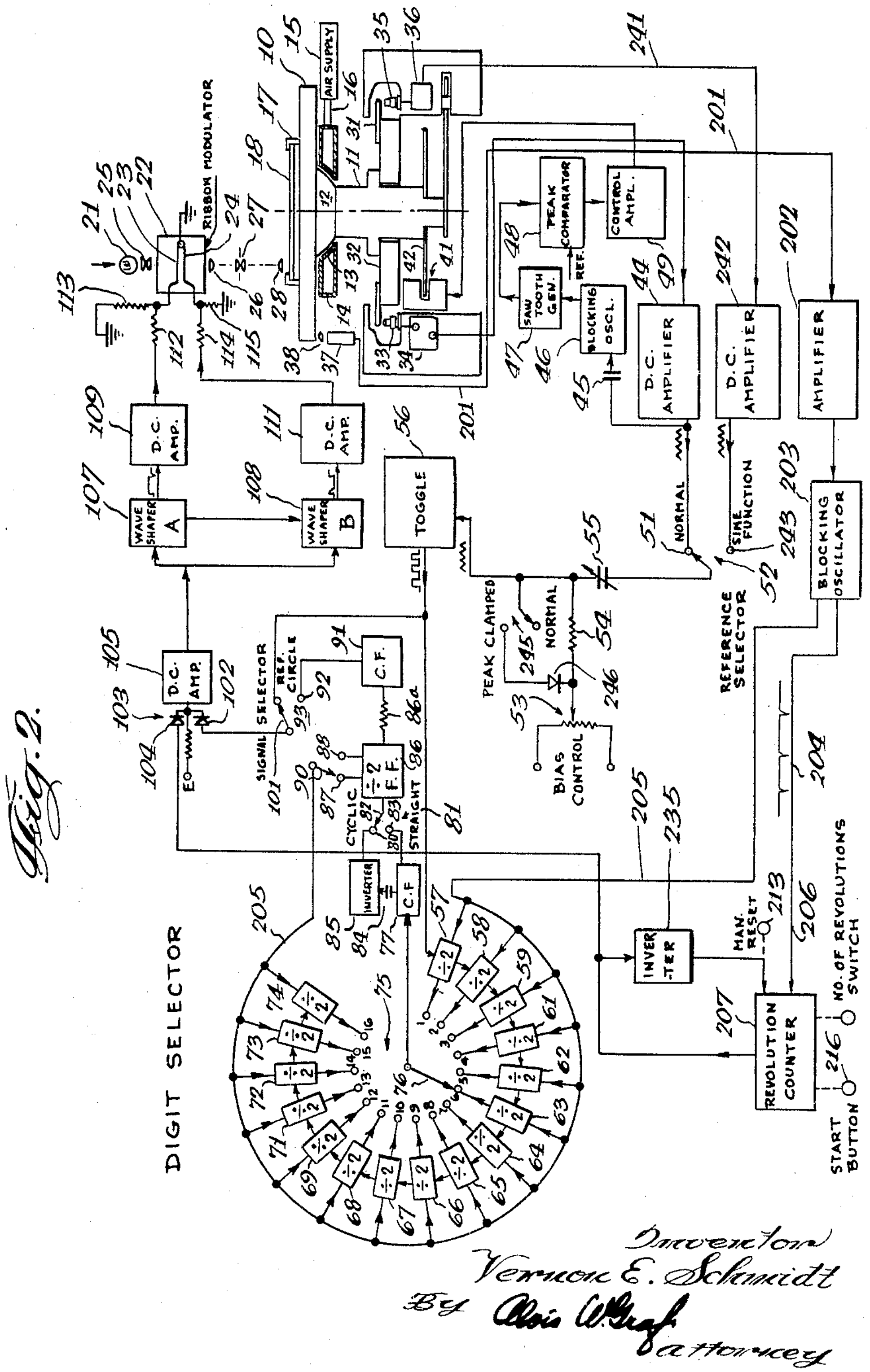
Figure 2 is a block diagram of a system for producing code patterns embodying details of this invention.

Generally speaking, the code disc producing machine of Figure 2 employs a turntable which carries a disc with a photosensitive surface which is to be photographically exposed. The turntable is rotated and synchronized with a pulse source which produces an integral number of pulses per revolution of the turntable. The pulse source is employed to control a beam of light impinging upon the photosensitive surface so that an integral number of exposed areas or sectors occur in a circular track on the photosensitive surface of the disc for each revolution of the turntable. For an adequate exposure, the cycle is repeated for a number of revolutions of the turntable.

In the embodiment set forth in the present application, the pulse source is itself a disc coaxially secured to the turntable which serves as the interruptor of a light source and photocell pulse generator. Since the number of pulses produced by the pulse source are fixed by the mechanical construction of the disc, a pulse selector is employed to count down to the desired number of pulses for producing the proper number of exposed sectors per revolution of the turntable.

A revolution counter is provided to permit exposure of the photographic surface on the turntable exactly a preset number of table revolutions. Both the revolution counter and the digit selector employ trigger circuits, and the trigger circuits of the digit selector are reset for each revolution of the turntable by a pulse generated from the turntable itself.

Exposures of both straight and cyclic binary codes are made with a single machine and may be on a common code disc. This is achieved for equivalent code tracks by employing a pulse frequency for the straight code twice that for the cyclic code and triggering a divide by two stage with the leading edge of each pulse for one code and the trailing edge for the other, thereby achieving proper phase relations.

Figure 3:
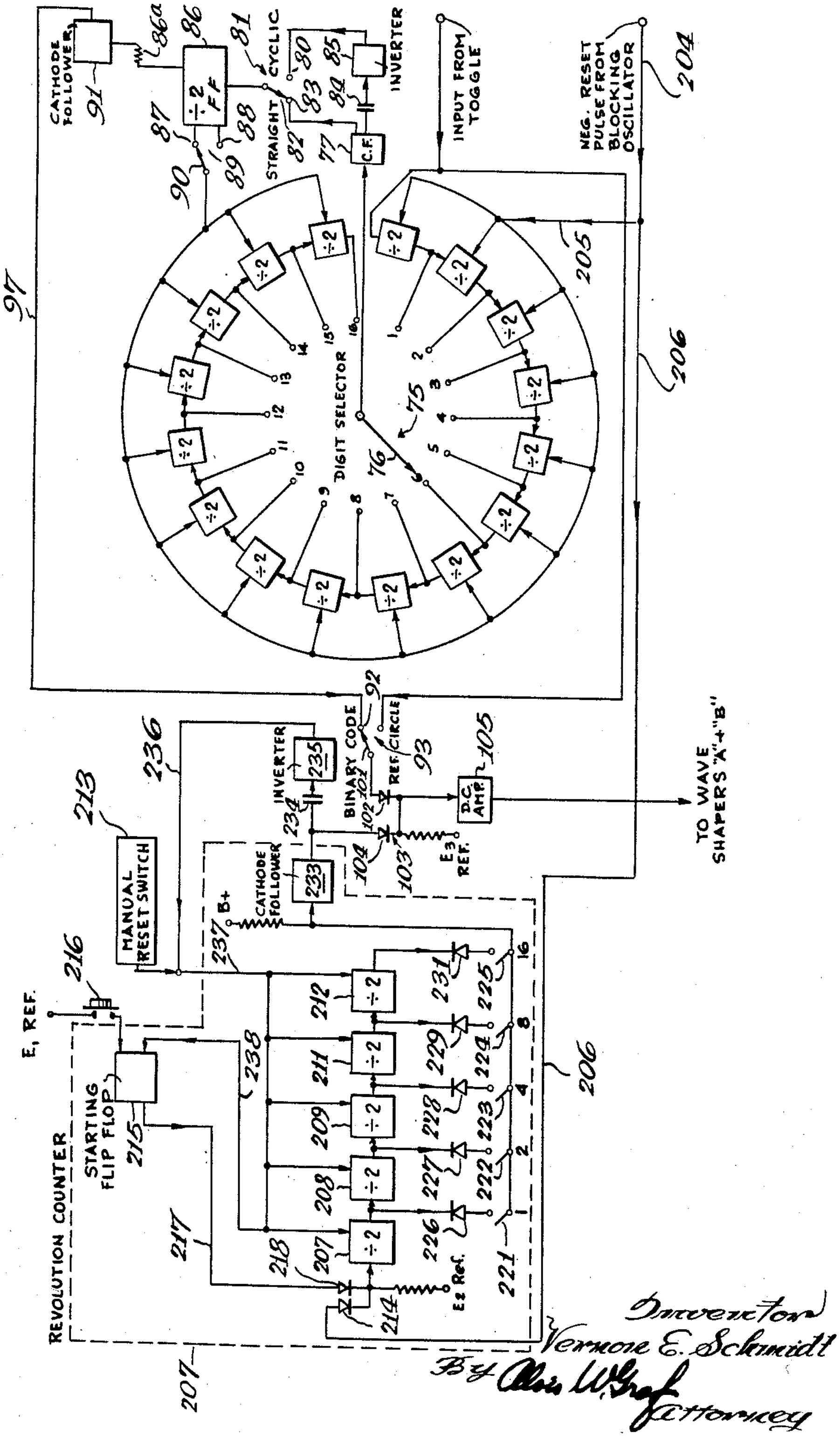
Figure 3 is a part block, part circuit diagram of the novel code generator of this invention.

Turning now to Figures 2 and 3 for the structure which produces the code patterns of Figure 1, there is shown in Figure 2 a turntable 10 rotatable about its vertical axis. Attached to the turntable 10 is a rotor 11. A portion of rotor 11 is a plano convex lens 12 which, together with a complementary spherical concave surface 13 of a stator 14, provides an air bearing surface which permits rotation of the turntable-rotor structure.

Previously it has been stated that the reference patterns on the disc 31 have thirty-two divisions in one instance and in the other sixteen lines. The particular reference pattern used is determined by the position of the switch 52. Further details about reference patterns and their utility is given in patent application Serial No. 436,831, filed June 15, 1954, by Edward M. Jones, for Electronic Synchronizing System for Producing Pitch Discs and the Like. The air space between the parallel stator and turntable surfaces is a part of the air bearing which is supplied with air from an air supply 15 through a pipe 16. For further details of the rotary air bearing, reference is had to the co-pending application of Edward M. Jones, Serial No. 475,165, filed December 14, 1954, now Patent No. 2,868,593.

Fixed on top of the turntable 10, by means of mounting flanges 17, is a photosensitive plate 18. The photosensitive plate 18 may be illuminated from a light source 21. A ribbon light modulator 22, having externally driven ribbons 23 and 24, controls the illumination of the photosensitive plate 18 by the light source 21. Appropriate lens groups 25, 26, 27 and 28 assure proper focusing of the light rays on the photosensitive plate 18.

A reference disc 31 is adjustably attached by means of a plate 32 to the rotor 11. On the reference disc 31 are two reference patterns, one of which has in the typical generator described thirty-two divisions, and the other sixteen parallel lines. If a more than 16 division system is desired, which would be greater than the examples shown in Figure 1, then an appropriately larger number of reference disc divisions and lines would be required. Further details and explanation of the second reference pattern are given in the copending patent application of Edward M. Jones, Serial No. 456,204, filed September 15, 1954, for a Digital Pattern Producing Equipment in connection with Figure 6 of that patent application. A light shines through the reference disc 31, and the light variations are picked up by a microscope objective 33 and focused on a photocell generator 34 to provide the main reference signal. Light is received by a microscope objective 35 through the other reference pattern on reference disc 31 and transmitted to a photocell generator 36 which provides the sine function reference signal. The respective reference patterns on disc 31 serve to provide pulses for triggering a digit selector divider chain to be subsequently described.

The turntable 10 provides a reference pulse once every revolution of the turntable, which is picked up by the reference pulse photocell 37 through a microscope lens group 38. For details of the reference pulse generating system, reference is had to the co-pending application of Edward M. Jones, Serial No. 475,202, filed December 14, 1954.

The turntable is driven by an eddy current motor 41 having its disc-shaped rotor 42 attached to the main turntable rotor 11. The eddy current motor is driven to match the slope of the wave forms applied to the ribbon modulator 22 by a speed control system. The signal from the main reference photocell generator 34 is amplified by a D.C. amplifier 44. The amplified signal is applied through a capacitor 45 to a blocking oscillator 46, which in turn triggers a saw tooth generator 47. If the turntable 10 runs too fast, the trigger output of the blocking oscillator 46 will occur too often so that these trigger voltages will appear too close together. This will prevent the saw tooth from ever reaching a predetermined peak amplitude, and as a result a motor control circuit consisting of a peak comparator 48 and a control amplifier 49 will apply a reverse torque on the eddy current motor 41. The peak comparator 48, by comparing the amplitude of the saw tooth generator output with a reference signal, determines whether the control amplifier will speed up or reduce the speed of the eddy current motor 41. If the motor is running too slow, the saw tooth amplitude will exceed the predetermined reference level, and the peak detecting circuit will cause the motor control circuit to put a forward torque on the motor. Thus, it is seen that the speed of the motor 41 can be readily controlled over a wide range by varying the RC time constant in the saw tooth circuit of the generator 47.

Under normal conditions the slope of the wave forms applied to the ribbon light modulator 22 will be set at a constant value, and the speed of the motor 41 will be adjusted inversely proportional to the radius of the zone of the photographic plate 18 being exposed. This means that the duration of the pulse of light received by any point on the plate will remain constant, and it will take the same number of revolutions of the turntable to expose each zone.

In the production of a linear straight binary code, the main reference photocell signal is amplified by a D.C. amplifier 44 as previously discussed. The output of this D.C. amplifier 44, in addition to being applied to the blocking oscillator 46, is also fed to a first contact 51 of a single pole-double throw switch 52. With the switch 52 in its "normal" position, the signal appearing on the contact 51 is applied through a variable capacitor 55 to a toggle circuit 56 which is triggered by the main reference photocell signal. A bias control consisting of a potentiometer 53 applies a selected biasing voltage through a resistor 54 to the input of the toggle circuit 56.

The toggle circuit 56 is a single shot multivibrator which does not change the frequency of the applied signal, but merely serves to produce a constant amplitude square wave signal when triggered by the main reference photocell signal. The negative going transition of the toggle circuit or square wave generator 56 is used to trigger a chain of Eccles-Jordan type flip-flop frequency dividers 57 to 74 of a digit selector. The symmetrical square wave output of one of these flip-flop circuits is selected by the pole 76 of a 16 contact selector switch 75. As to which flip-flop circuit of the divider chain 57 to 74 provides the output to the selector pole 76 will depend upon the zone of the code pattern which is being exposed.

The signal picked up by the selector pole 76 is applied to a cathode follower stage 77. The output of the cathode follower 77 is applied to a first contact 83 of a single pole-double throw switch 81. When the pole 82 of the switch 81 engages the contact 83, the switch 81 is in its straight code generating position, while if it engages the second contact 80, the switch 81 is in its cyclic code generating position. Since at the moment we are concerned with the generation of the straight binary code, the pole 82 of the switch 81 is positioned to engage its contact 83. The output of the cathode follower 77 is also applied through a capacitor 84 to an inverter stage 85. The output of this inverter stage 85 is connected to the contact 80 of the switch 81. Thus, it is clear that the signal voltage appearing on contact 83 is in phase with that selected by the pole 76 of the selector switch 75, while the signal voltage appearing on the contact 80 is 180° out of phase with that selected by the pole 76 of the selector switch 75.

The signal appearing on the selector pole 82 of the switch 81 is applied to a flip-flop divider 86. The output of the divider stage 86, which is applied through a resistor **86*a* to a cathode follower stage 91, can be reversed in phase by means of a single pole-double throw polarity switch 89**, as will be explained subsequently.

Figure 4:
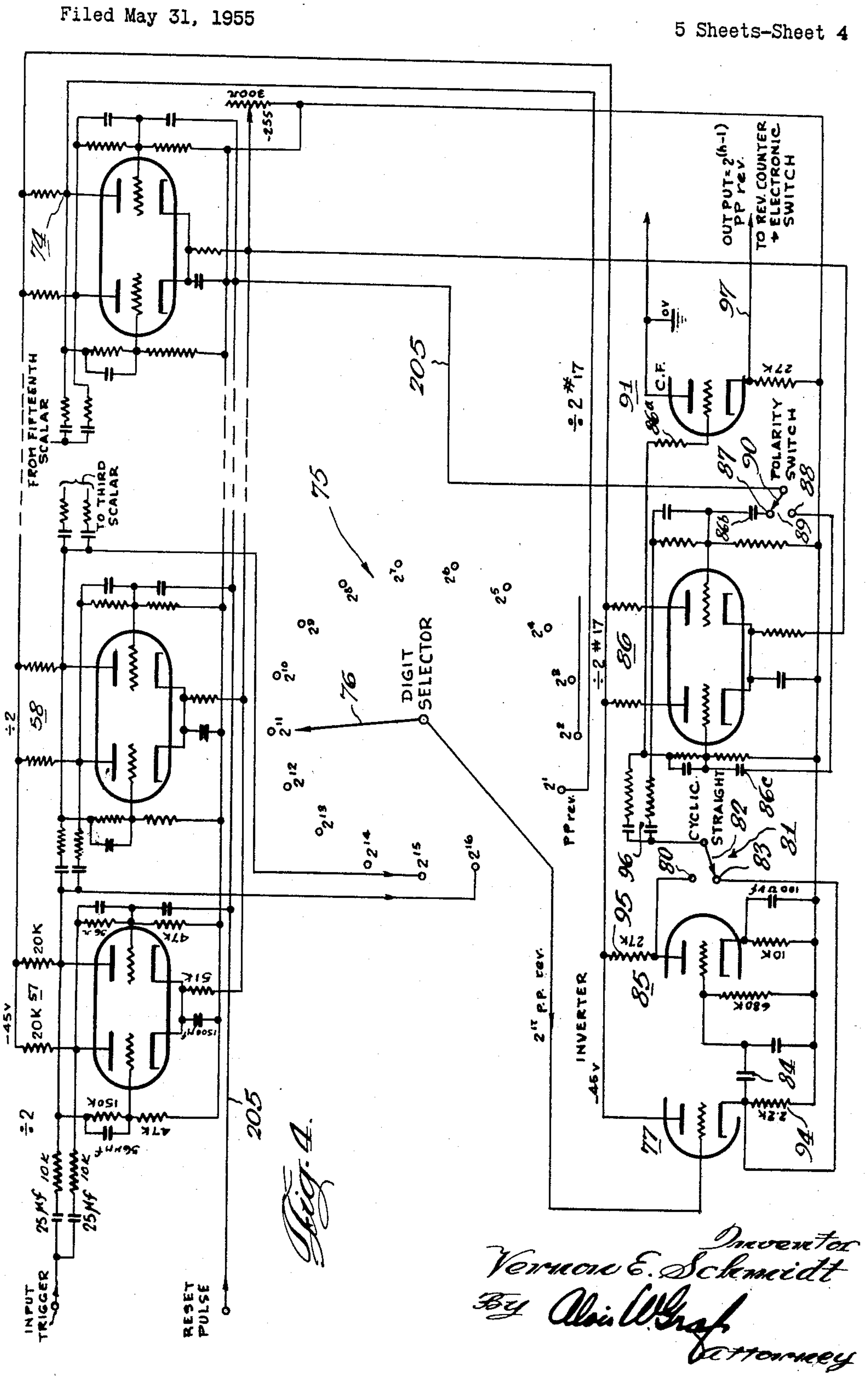
Figure 4 is a circuit diagram of certain portions of the code generator.

The detailed circuitry of the digit selector and associated circuit stages just described is shown in Figure 4. The input trigger, shown as being applied in the upper left hand corner of Figure 4, is the output of the toggle 56, and is applied by means of a capacitor coupling to the first flip-flop stage 57 of the divider chain consisting of flip-flop stages 57 to 74. Since such flip-flop multivibrator chains acting as frequency dividers are well known in the art, the operation and components of stages 57 to 74 will not be described further at this point. It should be noted that the reset pulse shown as applied to the divider chain through the conductor 205 is produced by appropriate circuitry from the turntable reference generator once each revolution of the turntable, as will be further described below.

The output of the frequency dividers 57 to 74 is taken from the plate circuit of the individual stages and applied to the respective contacts of the selector switch 75. The pole 76 of the selector switch 75 is connected to the grid of the cathode follower stage 77. The output of the cathode follower stage 77 is taken across its cathode resistor 94 and applied to the contact 83 of the selector switch 81 and also through the capacitor 84 to the grid of an inverter stage 85. The output of the inverter stage 85 is taken across its plate load resistor 95 and applied to the contact 80 of the switch 81.

An alternate arrangement for applying direct and inverted signals to the contacts 83 and 80, respectively, is to add a deck to the selector switch 75, connect the left-hand plates of the divider stages 57 to 74 to the fixed contacts of the deck and feed the output from the selector pole to the "cyclic" position contact 80. The output of the pole 76 would be fed directly to the "straight" position contact 83. In this arrangement a cathode follower would be connected between the pole 82 and the divider stage 86.

The selector pole 82 of the switch 81 applies the signal appearing on it through capacitive-resistive coupling components 96 to the flip-flop stage 86. As illustrated in Figures 3 and 4, the polarity switch 89 mentioned above, has a pole 90 for switching the reset pulse, available on the conductor 205, to either grid of the flip-flop 86 through appropriate coupling capacitors **86*b* and 86*c*, respectively, connected as shown (Figure 4), to contacts 87 and 88. Thus, the polarity of the output, which, as mentioned above, is applied through a resistor 86*a* to the cathode follower stage 91, may be reversed as desired, to determine whether the black part of the pattern to be formed on the photographic plate 18** represents 1 or 0 in the code, and whether the desired code proceeds clockwise or counter-clockwise.

Referring back to Figures 2 and 3, the output of the cathode follower stage 91 is carried by a conductor 97 (Figure 4) and appears on the selector pole 101 of the signal selector switch 93 when this switch is placed in its binary position to engage contact 92. The signal appearing on selector pole 101 is applied to a rectifier 102 which is part of a two-input "and" circuit 103. The second input to the "and" circuit 103 is provided by a revolution counter to be described hereafter and applied to a rectifier 104 of the "and" circuit 103. The output of the "and" circuit 103 is applied to a D.C. amplifier 105, the output of which is in turn applied to two wave shaper circuits 107 and 108 operating in parallel, each of which has its output signal amplified by a D.C. amplifier 109 and 111, respectively. The output of the D.C. amplifier 109 is applied to a resistance divider consisting of resistors 112 and 113. The output of this divider is taken from the common connection of resistors 112 and 113 to the ribbon 23 of the ribbon modulator 22. The output of the D.C. amplifier 111 is applied across a voltage divider consisting of resistors 114 and 115. The output from this divider is taken from the common connection between resistors 114 and 115 to drive the ribbon 24 of the ribbon light modulator 22.

The wave shapers 107 and 108 generate the wave form required for operating the ribbon light modulator 22. The purpose of the wave shapers is to modify the square waves as produced by the code generator consisting of the aforedescribed flip-flop stages, so that the slope of the sloping part of the wave forms of the voltages applied to drive the ribbons 23 and 24 corresponds fairly closely to the linear speed of the turntable at the particular radius being exposed. This is necessary in order to keep blurring of the code pattern on the photographic plate 18 to a minimum. The sloping parts of the wave forms are generated by boot strap circuits in which a capacitor is charged by means of a resistor, having a voltage thereacross which is kept constant to produce a linear saw tooth voltage across the capacitor.

Figure 5:
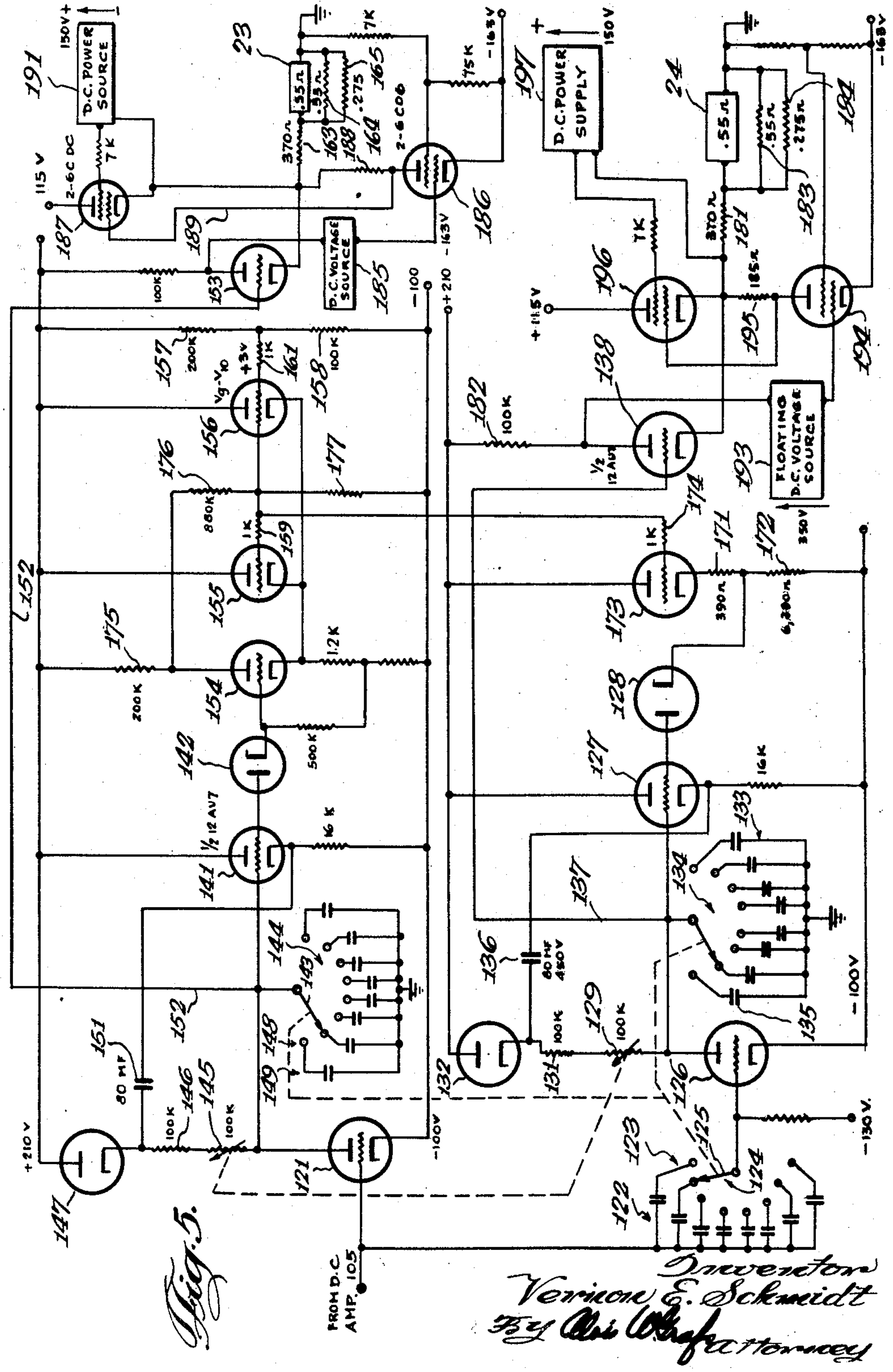
Figure 5 shows the driving circuits, including wave shapers and D.C. amplifiers, for the ribbon modulator.

Referring now more particularly to Figure 5 for details of the circuitry driving the ribbon light modulator 22, the output of the D.C. amplifier 105 is shown as applied to the grid of a triode 121 and the commonly connected terminals of a plurality of capacitors 122. The other terminals of the capacitors 122 are connected to a plurality of switch contacts 123, respectively, of a selector switch 124. The pole 125 of the switch 124 is connected to the grid of a triode 126 and through a resistor to a source of negative bias voltage. The plate of the triode 126 is connected to the grid of a triode 127, to the plate of a diode 128 and, through a variable resistor 129 in series with a fixed resistor 131, to the cathode of a diode 132. A plurality of capacitors 133 may be selectively connected by a selector switch 134 between the plate of triode 126 and ground. The pole 125 of the selector switch 124 and the selector pole of the switch 134 are ganged to move together. A capacitor 136 is connected between the cathodes of tubes 127 and 132. The output from the boot strap saw tooth generator, consisting of tubes 126, 127 and 132 and their associated circuit components, is taken from the plate of tube 126 through a conductor 137 to the grid of a triode 138.

The plate of the tube 121 is connected to the grid of a triode 141, to the plate of a diode 142, to the selector pole 143 of a switch 144 and through a variable resistor 145 in series with a fixed resistor 146 to the cathode of a diode 147. The contacts 148 of the switch 144, are respectively connected at one terminal of each of a plurality of capacitors 149. The capacitors 149 each has its other terminal connected to ground. A capacitor 151 interconnects the cathodes of the tubes 141 and 147. The variable resistors 129 and 145 are ganged together to move in synchronism. Similarly, the selector poles of switches 124, 134 and 144 are ganged together for movement from a central control (not shown).

The adjustable range provided by the variable resistors 129 and 145 and the ganged capacitors 123, 133 and 149 provides a large variety of slopes for matching the wave forms to the various speeds at which the turntable might be run. It should be noted that the variable resistors provide a continuous fine adjustment, while the variable capacitors provide a step incremental slope adjustment. Thus, in normal operation the variable resistor adjustment means would be set in the mid-range, while a rough matching of the wave form slope to the speed of the turntable is initially accomplished by stepping the capacitor switches 123, 134 and 144. This is followed by making the fine adjustment with the variable resistors 129 and 145.

In operation, the square wave from the D.C. amplifier 105 is referenced at a substantial negative voltage and inverted from the output of the flip-flop stage 86. When the square wave goes in a positive direction from its negative reference level, the tube 121 will draw considerable grid current permitting a particular selected capacitor 149 to charge to a potential very close to the potential of the cathode of the tube 121. When the square wave signal on the grid of the tube 121 goes in its negative direction, the tube is cut off and the particular capacitor 149 is allowed to charge through the resistors 145 and 146 to approximately the voltage appearing across capacitor 151. The capacitor 151 is initially charged to nearly the same voltage appearing at the plate of tube 147. As the capacitor 149 charges, the capacitor 151 takes this charging signal through the cathode follower connected tube 141 and raises the voltage appearing at the cathode of tube 147 so as to keep the voltage appearing across resistors 145 and 146 fairly constant in order to maintain a constant charging rate, and as a result, a linear voltage riser across the capacitors 149. The output of the boot strap saw tooth generator is taken from the plate of the tube 121 through a conductor 152 to the grid of a triode 153.

When the particular capacitor 149 has reached a selected positive potential, in the case of the present embodiment +100 volts, a triode 154, whose grid is connected to the cathode of the tube 142, starts to conduct. The cathode of the triode 154 is held at the selected voltage by a cathode follower 155 whose cathode is connected to the cathode of the tube 154. Thus, the voltage at which the triode 154 starts conducting can be accurately fixed. The cathode follower connected tube 155 may consist of one or more tube sections connected in parallel, depending on the tube type selected. Tubes 154 and 155 act like a cathode-coupled multivibrator and, upon conduction of tube 154, the cathodes immediately drop down in voltage, the grid current in tube 154 pulling down the voltage appearing at the plate of tube 121 and, therefore, across the particular capacitor 149 to a voltage level determined by a cathode follower connected tube 156.

The cathode of the tube 156 is connected to the cathode of tubes 154 and 155 It may be desirable to connect more than one triode section 156 in parallel to reduce the contact potential. The grid of the tube 156 is held at a small positive voltage by a voltage divider consisting of two resistors 157 and 158. Resistors 159 and 161 connected in the grid circuits of tubes 155 and 156, respectively, serve isolation purposes. The grid current drawn by the tube 154 keeps the voltage across the particular capacitor 149 at a low positive level until the next positive transition of the input square wave appearing at the grid of tube 121 occurs. The purpose of the diode 142 is to prevent the grid of tube 154 from going more negative than the tube rating allows.

The saw tooth wave form developed across the particular capacitor 149 controls the current flowing through the tube 153. In effect, the tube 153 acts as a gating tube controlling how much current will flow through the ribbon 23 of the light modulator 22 which is connected in series with a limiting resistor 163 in the cathode circuit of the tube 153. The ribbon current reaches a maximum when the grid of the tube 153 has gone to its maximum positive voltage as determined by the voltage appearing at the cathode of the triode 154, that is, the maximum excursion of voltage across the capacitors 149. Shunting resistors 164 and 165 are connected across the ribbon 23 to serve as dampening agents to lower the sharpness of mechanical resonance of the ribbon 23.

The wave form necessary to drive the ribbon 24 is generated in a somewhat similar manner as that just described for ribbon 23. The square wave from the D.C. amplifier is differentiated by one of the capacitors 122 as determined by the position of the selector pole 125 of switch 124. When the positive transition of this differentiated wave occurs, heavy grid current flows in the tube 126 for a time long enough to charge the particular capacitors 133, 135 to a selected negative voltage level. Thereafter tube 126 is cut off again, and the particular capacitors 133, 135 are charged in a linear manner through series connected resistors 129 and 131. The charging of the particular capacitor abruptly ceases when the voltage across that capacitor reaches a predetermined positive voltage, at which point the conduction of the tube 128 occurs as a result of the potential existing at the common connection between two resistors 171 and 172 connected in series in the cathode circuit of a tube 173. The grid of the tube 173 is returned through an isolation resistor 174 to a voltage divider, which consists of plate resistor 175 in series with resistors 176 and 177. The grids of tubes 155 and 173 are returned through their respective isolation resistors 159 and 174 to the common connection between the two resistors 176 and 177. At the time that tube 154 starts to conduct, the grid voltage appearing at the grids of tubes 155 and 173 drops abruptly due to the current flowing through its plate load resistor 175. This results in the conduction of tube 128 and the lowering of the voltage occurring across the particular capacitor 133 to its slightly negative quiescent voltage point. As in the case of the ribbon 23, the voltage wave form appearing across a particular capacitor 133 must be transformed into a current wave form for the ribbon modulator 22. This is again accomplished by feeding these signals into a unity gain amplifier utilizing the tube 138 to drive the ribbon 24 through a resistor 181.

The ribbon 24 is connected in series with the limiting resistor 181 in the cathode circuit of the tube 138, the plate of which is returned to B+ through a resistor 182. Two shunt resistors 183 and 184 are connected across the ribbon 24 to serve as dampening agents to lower the sharpness of mechanical resonance.

The ribbon 23 is driven by a series connected amplifier consisting of tubes 186 and 187. A signal is sent to the grid of the amplifier tube 186 from the plate of the triode 153. A signal derived from a plate load resistor 188 connected to the plate of the amplifier tube 186 is sent though a conductor 189 to the grid of the amplifier tube 187. When the tube 186 is cut off, the tube 187 is fully conducting, and when the tube 187 is cut off, the tube 186 is fully conducting.

It should be noted that the signal from the plate of the tube 153 is coupled to the grid of the tube 186 through a floating D.C. power supply 185. A D.C. floating power supply 191 is also needed to supply screen voltage to the amplifier tube 187. The cathode of triode 153 is connected to the cathode of the amplifier tube 187. This provides inverse feedback from the amplifier tube 186 to the triode 153 to give an overall gain of slightly less than unity for the amplified driving current.

The ribbon 24 driving voltage wave form is taken from the plate of triode 138 through a floating D.C. voltage source 193 to the grid of an amplifier tube 194. The plate of the amplifier tube 194 is connected through a resistor 195 to the cathode of an amplifier tube 196. The cathode of the amplifier tube 196 is connected to the cathode of the triode 138. The output of the amplifier tube 194 is taken from the plate of the tube 194 and applied to the grid of the tube 196. A D.C. floating power supply 197 is necessary to provide the screen voltage for the tube 196.

It will be noted from Figure 2 that a pulse is picked up once every revolution of the turntable 10 by means of the reference pulse photocell 37. The output of the photocell 37 is carried through a conductor 201 to a stabilized amplifier 202. The reference pulse is amplified by the amplifier 202 and triggers a blocking oscillator 203 which sends a reset pulse to all the frequency dividers setting them to a state of positive output.

Referring momentarily to the linear straight binary patterns shown in Figure 1, the reset pulse occurs slightly before $\theta=0°$, at which time the dividers 57 to 74 and 86 (if the switch 89 is in the correct position for the latter) of Figures 2 and 3 are supposed to be in a positive state as indicated by the dotted segments of the circles. Then at $\theta=0°$ a negative trigger is received from the toggle circuit 56 which in a cascade fashion makes all the frequency dividers go to a negative state. Succeeding triggers, indicated by the uniformly spaced radial lines, cause the normal binary counter action of the dividers, each one changing its state upon receiving the trigger when the previous stage makes a negative transition.

Referring now to Figures 2 and 3, it is seen that the negative reset pulse from the blocking oscillator 203 is carried through conductors 204 and 205 to actuate the divider flip-flop circuits 57 to 74 and the flip-flop stage 86. The reset pulse is also carried through conductors 204 and 206 to the revolution counter 207. Initially, the output of the five "divide by two" dividers 207, 208, 209, 211 and 212 are set to a condition of positive output, either by the manual reset switch 213 or automatically by a pulse generated at the end of the previous exposure by the blocking oscillator 203 and applied through a conductor 206 and a rectifier diode 214 to the dividers 207 through 212. The starting flip-flop circuit 215 is similarly initially reset.

A manual start switch 216 connects a reference voltage to the input of the starting flip-flop circuit 215 and triggers it to apply a voltage through a conductor 217 to a rectifier 218 which together with the rectifier 214 forms an "and" circuit to the input of the divider chain consisting of flip-flop circuits 207 to 212. The actuation of the start switch 216 causes the starting flip-flop circuit 215 to make a negative transition where it remains during the exposure of the photographic plate 18. Since the two rectifier diodes 214 and 218 form an "and" gate upon application of a voltage by the starting flip-flop circuit 215 through the conductor 217, it is also necessary to receive a pulse through conductor 206 in order to trigger the divider chain 207–212. This pulse occurs once per revolution of the turntable, and the first pulse that comes through triggers the chain of dividers 207 to 212 to a condition of negative output. This happens because the outputs are all positive to begin with, and a transition in each flip-flop circuit occurs when the previous stage makes a negative transition.

The negative transition output of the dividers 207 to 212 is transmitted through one or more of the diodes 226 through 231 and their respective switches 221 to 25 to a cathode follower stage 233 which biases the diode 104 so as to permit signals from the binary code generator to pass through the diode gate 103 of the "and" circuit consisting of the diodes 102 and 104.

Each of the diodes 226 to 231 is connected in series with one of the switches 221 to 225 to sense an output from its "divide-by-two" stage. Thus, closing of switch 221 will sense through diode 226 when a negative output signal is available from divide by two flip-flop 207. Whenever negative signals are applied simultaneously to diodes 102 and 104, an output signal will be applied to the D.C. amplifier 105 to separate the ribbons 23, 24 and expose the photographic plate 18.

The "and" gate 103 will remain open until a combination of positive outputs from the flip-flops 207 to 212 is obtained which corresponds exactly to the combination of those switches 221 to 225 in series with the diodes 226 to 231 which are closed. For example, the outputs of the dividers going to the diodes 226, 228 and 231 and their switches 221, 223 and 225 will not go positive simultaneously until the 21st pulse after the initial pulse entering the divider chain has occurred. Thus, the exposure has been made for 21 revolutions, the binary sum of the first, third and fifth digits. This combination will also occur on the 23rd, 29th and 31st pulses, but these pulses never occur because it is arranged to not only use the positive transition of the cathode follower 233 to close the gate 103 to the signal from the code generator but also to close the gate 214, 218 to the pulses that trigger the divider chain 207 to 212.

This is accomplished by generating a negative pulse at the positive transition of the cathode follower 233 output signal and using this pulse to reset the starting flip-flop circuit 215 to a condition of positive output which closes the "and" gate consisting of rectifier diodes 214 and 218 at the input of the divider chain. Circuitwise this is done by coupling the output signal of the cathode followers 233 through a capacitor 234 to an inverter stage 235. The output of the inverter stage 235 is applied through conductors 236, 237 and 238 to the starting flip-flop circuit 215 to reset that flip-flop circuit.

The output of the inverter stage 235 is also used to reset the frequency divider flip-flops 207–212 through conductors 236 and 237 to a condition of positive output in readiness for future exposures. A visual indication of the condition of flip-flop circuit of the divider chain 207 to 212 may be obtained by connecting a neon tube in the plate circuit of each flip-flop stage. As has been previously mentioned, the divider chain 207-212 and the starting flip-flop circuit 215 may also be reset by the operation of a manual reset switch 213.

To generate the linear cyclic binary code pattern, the switch 81 of Figures 2 and 3 is set in its cyclic position. The output of that digit-selector flip-flop circuit which has twice the desired frequency is fed through an inverter 85 to a divide-by-two flip-flop circuit 86 which thus triggers on the positive transition of the previous flip-flop. This relationship is shown by the arrows in Figure 1 which are going from two circles on the straight binary code to one of the circles on the cyclic code. When the two circles in the straight binary code are both started, the corresponding circle in the cyclic code is solid, that is negative; whereas when one of the circles is solid and the other circle is dotted, then the corresponding circle in the cyclic code is dotted, that is positive. It should be noted that the inner circle of the cyclic code is the same as the inner circle of the straight code, and for this zone therefore the switch 81 must be set in its straight position. The operation and actuation (including resetting) of the digit selector and its associated divider chain 57–74 is the same as in the production of the linear straight binary code, discussed above, and will not be repeated here.

To produce a sinusoidal cyclic binary code, the reference selector switch 52 is set to "sine function." In this position a reference pulse received from photocell 36 is used as the reference signal. This reference pulse is obtained from the disc 31. The output of the photocell 36 is applied through a conductor 241 to a D.C. amplifier 242. The output of the D.C. amplifier 242 is applied to the sine function contact 243 of the reference selector 52 and through that switch and the capacitor 55 to the toggle 56. A switch 245, usually in its normal position, is set into its peak clamp position in which the toggle circuit 56 input signal is clamped to the bias control potentiometer 53 voltage, through a diode 246.

In connection with the representation shown in Figure 1 it was stated that the reference track controlling the response of the photocell generator 34 had twice the number of black and white divisions as the largest number of divisions to be generated for the linear and cyclic binary codes. It was further stated that the number of lines on the other reference track controlling the photocell generator 36 had twice the number of lines as the greatest number of divisions, horizontally, of the sinusoidal cyclic binary pattern represented in Figure 1. Hence a divide by two flip flop 86 is included between the digit selector flip flops and wave shapers and associated circuits controlling the ribbon modulator 22.

The toggle 56 puts out a negative trigger at every one of the radial lines of the inner pattern in Figure 1 including 0°, 90°, 180° and 270° lines, though there is a slight error in this action. The inner set of patterns in Figure 1 show the operation of the frequency dividers, but it is not strictly the binary code for sine $\theta$ from 90° to 180°. From 0 to 90° the straight binary code for sine $\theta$ progresses +0.000, 0.001, 0.010, 0.011, 0.100, 0.101, 0.110, 0.111; the errors in sine $\theta$ being $-1/8$ to 0 unless .0001 ($1/16$) is added to each absolute value, in which case the error in sine $\theta$ is $\pm 1/16$. The conversion to cyclic code is shown in the next set of four circles. The conversion shown by the arrows is the same as for the linear code except that one circle is omitted. The inner circle of this group again represents the sign and the next three circles represent a three digit cyclic code for the magnitude of sine $\theta$ which is correct over the entire 360°, except that as above for greatest accuracy $1/16$ should be automatically added to each magnitude.

While there has been shown and described an invention in connection with certain specific embodiments it will, of course, be understood that it is not intended nor wished to be limited thereto since it is apparent that the principles herein disclosed are susceptible of numerous other applications, and modifications may be made in the circuit arrangement and in the instrumentalities employed without departing from the spirit and scope of this invention as set forth in the appended claims.

I claim as my invention:

1. A code generator for recording a code output signal on a recording medium comprising a digit selector including a flip-flop divider chain in which the transition in a predetermined direction from one stable state into its other stable state of one flip-flop will trigger into transition the next flip-flop, said divider chain having an input to be energized by a periodic reference signal, the output of said digit selector being applied to a bistable divide-by-two means, said divide-by-two means being triggered into transition to its other state by the reverse direction transition in state from said predetermined direction of the actuating flip-flop of said divider chain as selected by said digit selector to produce a code output signal.

2. A code generator according to claim 1 including a rotary member carrying a recording medium, said member being provided with a revolution counter having a selective code output, and a gate actuated by the outputs of said revolution counter and said divide-by-two means to provide the selected code output until the gate is closed by said revolution counter.

3. A code generator according to claim 2 in which means connected to the output of said revolution counter reset said counter upon said closing of said gate.

4. A code generator according to claim 2 having a follower stage and an inverter stage connected to the output of said digit selector, and switchable means for selecting the output either of the follower stage or the inverter stage to be applied to said divide-by-two means so that the code generator is capable of generating a plurality of codes.

5. A code generator according to claim 2 in which switchable means permit the selection of either polarity of output of said divide-by-two means.

6. A code generator according to claim 3 in which said revolution counter includes a starting flip-flop, said starting flip-flop being reset by said revolution counter reset means, said starting flip-flop being connected to a gate at the input to said revolution counter, said gate being disabled by said reset-starting flip-flop from passing input triggers to said revolution counter.

7. In a code pattern generator for recording a code output signal on a recording medium, the combination of a flip-flop divider chain in which the transition in a predetermined polarity direction from one stable state into its other stable state of one flip-flop will trigger into transition the next flip-flop, said divider chain having an input to be energized by a periodic reference signal, a bi-stable divide-by-two means, and selective means connected between respective flip-flops in said chain and said divide-by-two means, for applying a trigger from a selected flip-flop to said divide-by-two means, said divide-by-two means being triggered from one state to its other state by the reverse polarity direction transition in state from said predetermined polarity direction of said selected flip-flop to produce a code output signal.

8. In a code pattern generator for producing a code pattern on a recording medium, the combination of a flip-flop divider chain in which the transition in a predetermined direction from one stable state into its other stable state of one flip-flop will trigger into transition the next flip-flop, a bi-stable divide-by-two means, and circuit means coupling a flip-flop in said chain with said divide-by-two means, said circuit means including a selector for applying a trigger from a selected flip-flop to said divide-by-two means for triggering said divide-by-two means from one state to its other state selectively either by the reverse direction transition in state from said predetermined direction or the same direction transition in state as said predetermined direction so as to have the code generator be capable of generating a plurality of codes.

9. In a code pattern generator, the combination of a divide-by-two means, a selector switch having a pole terminal connected to the divide by two means and a plurality of contacts, a chain of flip-flop dividers each having two outputs of different polarities, one being connected to the next flip-flop in the chain to trigger its operation, the other being connected to one of the contacts of the switch, and thereby to the divide-by-two means to trigger its operation so as to provide an output which is shifted in phase 90° with respect to the output of said next flip-flop divider.

10. In a code pattern generator, the combination of a chain of flip-flop dividers each having two outputs of opposite polarity, a divide-by-two means, and switchable means having two paths, one of said outputs being connected to the next flip-flop in the chain to trigger its operation and said output of the last flip-flop of the chain being connectable through the first path of said switchable means to said divide-by-two means to trigger its operation to produce an output, the other of said outputs of the last flip-flop of the chain being connectable through the second path of said switchable means to said divide-by-two means to trigger its operation so as to produce an output 90° in phase from the output produced through said first path.

11. A device for producing code discs comprising, in combination, a turntable, means for directing a beam of light onto the turntable, means connected to the turntable to rotate the turntable, means for generating an integral number of pulses per revoluion of the turntable, means connected to the pulse generating means for interrupting the light beam including a code generator having a plurality of divide by two flip-flop circuits connected in a cascade chain and each flip-flop having a reset input, a transition from one stable state to the other in a first direction triggering the following flip-flop in said chain, and a divide by two stage connected to the last flip-flop of the chain, said divide by two stage triggering responsive to a transition opposite to the first direction, a revolution counter having a plurality of cascaded flip-flop stages, means for generating a single pulse for each revolution of the turntable connected to the input of the first of said flip-flop stages in the revolution counter and to the reset input of each of the flip-flop stages in the code generator, a gate connected between the divide by two stage and the light interrupting means, said gate being responsive to the output of the revolution counter, and means for resetting the flip-flop circuits of the revolution counter to respond to the pulse of the means for generating a single pulse for each revolution of the turntable, the initial pulse from said generating means actuating the revolution counter and opening the gate.

12. A device for producing code discs comprising the elements of claim 11 wherein the revolution counter includes an outer terminal connected to a source of direct potential through an impedance element, a diode connected between the output terminal and the output of each flip-flop to pass charges from the source to the flip-flop, whereby all flip-flops must trigger to interrupt the flow of charge and change the potential of the output terminal.

References Cited in the file of this patent

UNITED STATES PATENTS 2,493,627 Grosdoff ---------------- Jan. 3, 1950
2,521,789 Grosdoff --------------- Sept. 12, 1950

UNITED STATES PATENT OFFICE
CERTIFICATE OF CORRECTION

Patent No. 2,907,996 October 6, 1959

Vernon E. Schmidt

It is hereby certified that error appears in the printed specification of the above numbered patent requiring correction and that the said Letters Patent should read as corrected below.

Column 7, line 33, for "riser" read -- rises --; column 9, line 63, for "25" read -- 225 --; column 12, line 71, for "revoluion" read -- revolution --; column 14, line 3, for "outer" read -- output --.

Signed and sealed this 24th day of May 1960.

(SEAL)
Attest:
KARL H. AXLINE
Attesting Officer

ROBERT C. WATSON
Commissioner of Patents